(12) United States Patent
Kántor et al.

(10) Patent No.: US 10,516,394 B2
(45) Date of Patent: Dec. 24, 2019

(54) SENSOR ELEMENT OF AN INDUCTIVE PROXIMITY OR DISTANCE SENSOR CONTAINING COIL ARRANGEMENT HAVING ELECTRICALLY-CONDUCTIVE SHIELDING WITH FLANGE COMPLETELY ENCLOSING THE COIL ARRANGEMENT AND METHOD FOR OPERATING THE SENSOR ELEMENT

(71) Applicant: Balluff GmbH, Neuhausen a.d.F. (DE)

(72) Inventors: Zoltán Kántor, Nemesvámos (HU); Zoltán Pólik, Gyoer (HU); Zoltán Kanyár, Eplény (HU); Szabolcs Herczeg, Veszprém (HU); János Viszt, Veszprém (HU); Reider Tamás, Tenyoe (HU)

(73) Assignee: Balluff GmbH, Neuhausen a.d.F. (DE)

( * ) Notice: Subject to any disclaimer, the term of this patent is extended or adjusted under 35 U.S.C. 154(b) by 204 days.

(21) Appl. No.: 15/509,556

(22) PCT Filed: Sep. 9, 2014

(86) PCT No.: PCT/DE2014/100329
§ 371 (c)(1),
(2) Date: Mar. 8, 2017

(87) PCT Pub. No.: WO2016/037597
PCT Pub. Date: Mar. 17, 2016

(65) Prior Publication Data
US 2017/0302273 A1    Oct. 19, 2017

(51) Int. Cl.
*H03K 17/95* (2006.01)
*H01F 27/36* (2006.01)

(52) U.S. Cl.
CPC ......... *H03K 17/952* (2013.01); *H01F 27/365* (2013.01); *H03K 17/9505* (2013.01);
(Continued)

(58) Field of Classification Search
USPC .................................................. 324/207.26
See application file for complete search history.

(56) References Cited

U.S. PATENT DOCUMENTS 3,292,052 A * 12/1966 Richter .................. G01V 3/107
 307/116
4,419,646 A    12/1983 Hermle
(Continued)

FOREIGN PATENT DOCUMENTS

DE    29 51 968 A1    7/1981
DE    38 39 386 A1    5/1990
(Continued)

OTHER PUBLICATIONS

German Office Action in DE 11 2014 006 936.1, dated Jun. 29, 2018.
(Continued)

*Primary Examiner* — Jay Patidar
(74) *Attorney, Agent, or Firm* — Collard & Roe, P.C.

(57) ABSTRACT

A sensor element of an inductive proximity sensor or distance sensor contains a coil arrangement with at least one excitation coil and at least one receiving coil and includes an electrically conductive shielding which contains a shielding cup that surrounds the coil arrangement laterally and on the rear face. A method operates the sensor element. The shielding of the sensor element further contains a flange which is provided on the front face of the sensor element, is connected to the shielding cup in an electrically conductive manner, and completely surrounds the coil arrangement.

23 Claims, 13 Drawing Sheets

(52) U.S. Cl.
CPC . *H03K 17/9502* (2013.01); *H03K 2017/9527* (2013.01); *H03K 2217/952* (2013.01)

(56) References Cited

U.S. PATENT DOCUMENTS

| | | | | |
|---|---|---|---|---|
| 4,740,747 | A | * | 4/1988 | Kawashima ........... G01N 27/72 324/203 |
| 4,804,912 | A | * | 2/1989 | Lysen ...................... G01B 7/14 324/207.17 |
| 5,414,402 | A | | 5/1995 | Mandai et al. |
| 5,801,531 | A | | 9/1998 | Viches et al. |
| 6,130,489 | A | * | 10/2000 | Heimlicher ........... H03K 17/952 307/125 |
| 6,734,665 | B2 | | 5/2004 | Jagiella et al. |
| 7,463,020 | B2 | | 12/2008 | Kuehn |
| 7,701,191 | B2 | | 4/2010 | Skultety-Betz et al. |
| 8,441,251 | B2 | | 5/2013 | Thoss et al. |
| 2001/0019262 | A1 | * | 9/2001 | Woolsey ................ G01B 7/023 324/207.26 |
| 2002/0070729 | A1 | * | 6/2002 | Muller ............... H03K 17/9525 324/207.26 |
| 2003/0071708 | A1 | | 4/2003 | Schmidt |
| 2008/0007245 | A1 | * | 1/2008 | Skultety-Betz ........ G01V 3/104 324/67 |
| 2008/0204118 | A1 | * | 8/2008 | Kuhn ................. H03K 17/9505 327/517 |
| 2010/0207611 | A1 | | 8/2010 | Thoss et al. |
| 2011/0089938 | A1 | | 4/2011 | Schmidt |
| 2012/0306824 | A1 | * | 12/2012 | Horie .................. G06F 3/03545 345/179 |
| 2014/0097831 | A1 | * | 4/2014 | Whaley ................. G01V 3/104 324/207.15 |

FOREIGN PATENT DOCUMENTS

| | | |
|---|---|---|
| DE | 41 02 542 A1 | 7/1992 |
| DE | 43 38 084 A1 | 5/1994 |
| DE | 197 40 774 A1 | 3/1998 |
| DE | 101 22 741 A1 | 11/2002 |
| DE | 103 50 733 A1 | 5/2005 |
| DE | 100 48 290 C5 | 12/2005 |
| DE | 10 2005 007803 A1 | 8/2006 |
| DE | 10 2006 040 550 A1 | 3/2007 |
| DE | 10 2007 010 467 A1 | 9/2008 |
| DE | 10 2010 007 620 A1 | 9/2010 |
| EP | 0 492 029 A1 | 7/1992 |
| EP | 0 751 623 A1 | 1/1997 |
| EP | 1 296 160 A1 | 3/2003 |
| EP | 1 372 173 A1 | 12/2003 |
| EP | 2 493 076 A1 | 8/2012 |
| EP | 2 533 139 A2 | 12/2012 |
| WO | 2006/084675 A1 | 8/2006 |
| WO | 2012/140265 A2 | 10/2012 |

OTHER PUBLICATIONS

International Search Report of PCT/DE2014/100329, dated Aug. 5, 2015.

* cited by examiner

US 10,516,394 B2

SENSOR ELEMENT OF AN INDUCTIVE PROXIMITY OR DISTANCE SENSOR CONTAINING COIL ARRANGEMENT HAVING ELECTRICALLY-CONDUCTIVE SHIELDING WITH FLANGE COMPLETELY ENCLOSING THE COIL ARRANGEMENT AND METHOD FOR OPERATING THE SENSOR ELEMENT

CROSS REFERENCE TO RELATED APPLICATIONS

This application is the National Stage of PCT/DE2014/100329 filed on Sep. 9, 2014, the disclosure of which is incorporated by reference. The international application under PCT article 21(2) was not published in English.

The invention is based on a sensor element of an inductive proximity sensor or distance sensor according to the type of the independent claim.

The invention further relates to a method for operating the sensor element of the inductive proximity or distance sensor.

PRIOR ART

The applicant manufactures and markets measuring devices for recognising objects that are based on different physical principles, such as inductive distance sensors, inductive proximity sensors, micro-pulse displacement pick-ups, magneto-inductive displacement sensors, magnetic-coded displacement and angle measuring systems, for example, and opto-electronic distance sensors, for example. The measuring devices determine, for example, the position of a mobile object in relation to a position sensor or the distance of a mobile object from the position sensor or, for example, simply the presence of a measuring object.

In the patent specification U.S. Pat. No. 5,801,531 A, an inductive proximity sensor is described that enables an increased switching distance. The increased switching distance is achieved by a shielding of the inductive sensor. The shielding is implemented by a metallic plate and a housing made of non-ferromagnetic material, which surrounds a ferrite core. The ferrite core is wound by a coil.

In the published patent application DE 38 39 386 A1, an inductive proximity sensor is described that has an excitation coil that is surrounded by a receiving coil according to a first embodiment. According to a different embodiment, a two-part receiving coil is provided, wherein the two partial coils are arranged behind the excitation coil in relation to a measuring object or in relation to the measuring direction. Distinction can be made between measuring objects that are ferromagnetic and those which are electrically-conductive but non-ferromagnetic.

The published patent application DE 197 40 774 A1 describes an inductive proximity sensor that has both two excitation coils and two receiving coils. The two receiving coils are, in terms of the sensor axis, positioned between the two excitation coils. The two excitation coils are inversely energised.

In the published patent application DE 101 22 741 A1, a metal detector is described that has two excitation coils and one receiving coil. All the coils are positioned concentrically on one common axis. The two excitation coils are dimensioned in terms of their winding numbers and/or their dimensions in such a way and the excitation currents fed into the two transmitter coils are measured in terms of their mutual phase positions and/or in terms of their amplitudes in such a way that the currents induced into the receiving coil by the two excitation coils mutually compensate one another.

An inductive proximity sensor has been known from the published patent application DE 10 2010 007 620 A1, which has two excitation coils and two receiving coils, according to one exemplary embodiment, said coils, in relation to the measuring object, being arranged concentrically behind one another having the same diameter in each case. The transmitter coils and the receiving coils mutually alternate, wherein the first transmitter coil is arranged nearest to the measuring object.

The inductive proximity sensor described in the published patent application DE 10 2007 010 467 A1 contains two excitation coils and two receiving coils arranged symmetrically relative to the excitation coils and coaxially within the excitation coils. The receiving coils are inversely switched in series. A shielding of the coil arrangement constructed coaxially is provided. The depth of the inductive proximity sensor is greater than the diameter.

In the published patent application EP 751 623 A1, a proximity sensor is described that has a resonance circuit which contains a coil wound on a ferrite core. The known inductive proximity sensor can be implemented with a high ratio of width to depth, however, it has increased sensitivity to a disrupting external electromagnetic field. The attainable switching distance depends on the material factor.

The published patent application DE 10 2006 040 550 A1 describes an inductive proximity sensor that contains a sensor element having two excitation coils and two receiving coils that are positioned symmetrically relative to the excitation coils and are inversely switched in series. The sensor element is situated in a cylindrical, high-grade steel housing which has an external thread. A cover is provided on the detection surface on the front end of the housing in relation to the measuring object, said cover consisting of a non-magnetic high-grade steel. A pre-damping element is provided on the back end of the sensor element in relation to the measuring object, the properties of which pre-damping element should correspond to those of the cover and the housing on the detection surface for compensating the influences of the cover and the housing on the detection surface.

An inductive proximity sensor has been known from the published patent application EP 1 296 160 A1, which has one excitation coil and one receiving coil which are arranged on both sides of a circuit board. The circuit board can have magnetic properties in order to provide a magnetic separating wall.

In the US published patent application 2011/0089938 A1, an inductive proximity sensor is described, the sensor element of which contains two excitation coils and one receiving coil. The excitation coils simultaneously provide magnetic fields with opposing polarity. The receiving coil is arranged between the two excitation coils. An equalisation of the sensor element is provided in the absence of a measuring object. An equalisation of the sensor element can further be provided in the presence of a stationary object.

In the published patent application WO 2012/140265 A2, a development of the inductive proximity sensor described in the US published patent application 2011/0089938 A1 is specified which provides a target for the excitation currents for the excitation coils with the most different temporal signal courses.

The object of the invention is to specify a sensor element of an inductive proximity or distance sensor and a method for operating the sensor element with which a high switching distance can be achieved at the same time as a high level of insensitivity to disturbances.

The object is respectively solved by the features specified in the independent claims.

DISCLOSURE OF THE INVENTION

The invention is based on a sensor element of an inductive proximity sensor or distance sensor that contains a coil arrangement having at least one excitation coil and a least one receiving coil, wherein an electrically conductive shielding is provided that contains a shielding cup which surrounds the coil arrangement laterally and on the rear face. The sensor element according to the invention of the inductive proximity or distance sensor is characterised in that the shielding further contains a flange which is provided on the front face of the sensor element which is connected to the shielding cup to conduct electricity and which completely encloses the coil arrangement.

The terms "front face" or "rear face" of the sensor element in the present application are, at all times, to be considered in relation to the measuring object, wherein the front face should be nearest to the measuring object.

The sensor element according to the invention enables a large switching distance or a large proximity region of a measuring object, wherein the measuring object together with the sensor element according to the invention forms the inductive proximity sensor or inductive distance sensor.

The shielding provided laterally and on the rear face of the sensor element by means of the shielding cup shields, in particular, the higher-frequency electromagnetic signal components present on the rear face of the sensor element such that the higher-frequency signal components of the electromagnetic fields emitted from the excitation coils reach the metallic surfaces, for example mounting components that are positioned on the rear face of the sensor element, are attenuated or do not reach them at all.

The lateral parts of the shielding cup attenuate, in particular laterally present, higher-frequency electromagnetic signal components. Thus, the sensor element according to the invention is suitable, in particular, for a flush installation in an electrically conductive surface.

The flange on the front end as part of the shielding, which should completely enclose the coil arrangement, decouples the two half spaces, in particular, which are located in front or behind the front face of the sensor element. The shielding effect, in particular, consists in that eddy currents can form in the flange. The flange prevents, in particular, sensitivity of the sensor element to metallic objects that are located on the rear face of the sensor element. The shielding effect of the flange as part of the shielding supports the possibility of the completely flush installation of the sensor element according to the invention in an electrically conductive surface, wherein only one recess should be present in the region of the coil arrangement of the sensor element in the electrically conductive surface.

The sensor element according to the invention can be implemented with a comparatively high width-depth ratio such that a comparatively large proximity-detection region or a large switching distance can be achieved.

A sensor function that can be freely configured can be predetermined by the sensor element according to the invention. On the one hand, a material selectivity in terms of the material of the measuring object can be predetermined. Similarly, however, an independence from the material of the measuring object can also be predetermined, which corresponds to a factor-1 operation.

Advantageous developments and embodiments of the sensor element according to the invention of an inductive proximity sensor or the inductive distance sensor are respectively subject matters of dependent device claims.

A first embodiment provides that the shielding cup is made from one piece. The shielding cup can thus be cost-effectively produced, for example by deep-drawing.

Furthermore, it can alternatively or additionally be provided that the shielding cup and the flange are made from one piece. Thus, the production of the whole shielding from the shielding cup and the flange becomes cost-effective.

The flange can be implemented as one massive metallic part or preferably as a metal film. The film enables a reduction of costs.

Other embodiments relate to the coil arrangement.

According to one embodiment, it is provided that the coil arrangement on the back end contains an excitation coil used as a compensation coil. The excitation coil provided on the rear face of the sensor element, in relation to the detection direction, and used as a compensation coil enables compensating, in particular, the influence which is present through the rear face of the shielding cup. In particular, a high compensation of a background signal occurring because of the unsymmetrical shielding of the coil arrangement can be achieved by suitably setting the compensation coil-excitation current in terms of the signal increase and/or the current maximum and/or the signal drop, said background signal being measured without a measuring object.

One embodiment provides that the coil arrangement is arranged on layers of a multi-layer board. Additionally or alternatively, an electronic unit arranged on at least one layer of the multi-layer board can be provided. In doing so, as short a cable run as possible of the connection cables between the coil arrangement and the electronic unit including the electronic unit emerges. In doing so, on the one hand, the disturbing distance further increases and, on the other hand, a cost-effective implementation of the sensor element according to the invention becomes possible. An alternative or further cost-reduction possibility is thus given by the back part of the shielding being able to be implemented as a metallic layer on at least one layer of the multi-layer board.

Mounting the coil unit is particularly easy if the shielding cup is soldered to the multi-layer board. Correspondingly, it can additionally or alternatively be provided that the flange is implemented as at least one metallic revolving layer on the frontmost layer of the multi-layer board.

A simple mounting can thus also be achieved by the shielding cup having at least one cantilever extension for fixing the shielding cup on the multi-layer board.

Further embodiments of the sensor element according to the invention of the inductive proximity sensor or the inductive distance sensor relate to signal processing.

Preferably, each excitation coil is connected to a voltage-controlled current source which provides the excitation current of the excitation coil. The controlled current source enables the specific target of parameters of the excitation current, such as the temporal current course and/or a current maximum, for example.

A development of this embodiment provides that an ohmic resistor is switched in parallel to the excitation coil respectively to all the excitation coils. The parallel-switched resistor supports a stable operation of the current source because of the ohmic component, in addition to the inductivity of the excitation coil.

One embodiment provides that, on the input of the voltage-controlled current source, a signal shaper is provided that is preferably implemented as a bandpass filter. In doing so, a simple current signal shaping is attained, based on a square signal that is provided by a microcontroller, for example. The bandpass filter suppresses high-frequency signal components of the original square signal, which the voltage-controlled current source would not follow and bring into saturation. At the same time, lower-frequency signal components and, in particular, the direct signal components, which would lead to very high current consumption, which is also not desirable.

An intermittent functioning of the current source because of an offset of the current source is avoided by a direct current voltage being switched on the output of the signal shaper. A saturation of the current source in a negative direction is thus effectively avoided such that at any point during the excitation period, at least one small excitation current is flowing.

For the signal processing of the measuring voltage provided by the at least one receiving coil, a two-level amplifier is preferably provided. Here, a suitable embodiment provides that at least the first level of the two-level amplifier is a capacitor-coupled transimpedance amplifier, the amplifier factor of said transimpedance amplifier being able to be adjusted by passive components in order to enable an adjustment of the sensor element to the measuring task in a simple manner.

One development of the embodiment having the two-level amplifier provides a switchable signal attenuator that is switched between the two amplifier levels. The signal attenuator enables a particularly simple adaptation of the peak voltages occurring at the output of the first amplifier levels to the second amplifier level and thus effectively prevents overcontrolling the second amplifier level. The signal attenuator is preferably controlled by the microcontroller by a time delay in terms of the start of the excitation current pulse, which is set at a value at which, the signal maximum at the input of the second amplifier level can be specifically reduced.

A substantial advantage that has already been mentioned of the sensor element according to the invention is achieved by the sensor element having the coil arrangement and the shielding being arranged in a housing which has a greater width than depth, wherein the depth is related to the sensor direction. Such a housing is particularly suitable for the flush installation already mentioned into a larger surface that can be metallically conductive, in particular because of the shielding measures.

The method for operating the sensor element according to the invention provides a determination of the distance of a measuring object from the sensor element or a determination of the proximity of a measuring object to the sensor element.

In doing so, the temporal course of the excitation current flowing in at least one excitation coil and/or a maximum of the excitation current is preferably set in such a way that the background signal contained in an output signal obtained from a measuring voltage, said background signal being present without a measuring object, is minimised. Setting the predetermined temporal course of the excitation current and/or of the maximum of the excitation current are expediently determined experimentally. Minimising the background signal enables high amplification of the useful signal induced by the measuring object, without bringing the second amplification level to saturation.

When evaluating the signal, the background signal can additionally be subtracted digitally from the output signal.

An optimal adjustment to the measuring task can take place by the temporal course of the excitation current and/or the maximum of the excitation current being set in such a way that the sensitivity of the output signal is maximised in terms of a certain measuring object. The at least one parameter of the excitation current is preferably determined experimentally. If several parameters are to be determined then, preferably, all parameters are determined experimentally.

A further improvement when operating the sensor element according to the invention is achieved by the temperature of the excitation coil additionally being taken into consideration when setting the temporal course of the excitation current and/or the maximum of the excitation current. The temperature, for example, can be measured by a sensor or calculated from a measurement of the internal resistance of the excitation coil.

An additional or alternative possibility to optimise the useful signal/background ratio is to supply all the excitation coils with a respective current impulse at the same time.

Due to the fact that different materials of the measuring object lead to different maxima and temporal courses of the output signal, the inductive distance sensor or the inductive proximity sensor can be used to determine the magnetic and/or electric properties of the measuring object by means of evaluating the output signal in terms of the maxima and/or the temporal signal course. To do so, at a known distance, the concerned measuring object is measured and the resulting output signals are stored for later comparison.

It is thus possible to operate the sensor element dependently from the electric and magnetic properties of the material of the measuring object. Alternatively, it is however also possible, in particular, to operate the sensor element independently of these properties of the measuring object, such that a so-called factor-1 operation can be provided, in which the measuring results are provided independently of the material of the measuring object.

Further advantageous developments and embodiments of the sensor element according to the invention emerge from the following description.

Exemplary embodiments of the invention are depicted in the drawing and are explained in more detail in the description below.

DETAILED DESCRIPTION OF THE EXEMPLARY EMBODIMENTS

Figure 1:
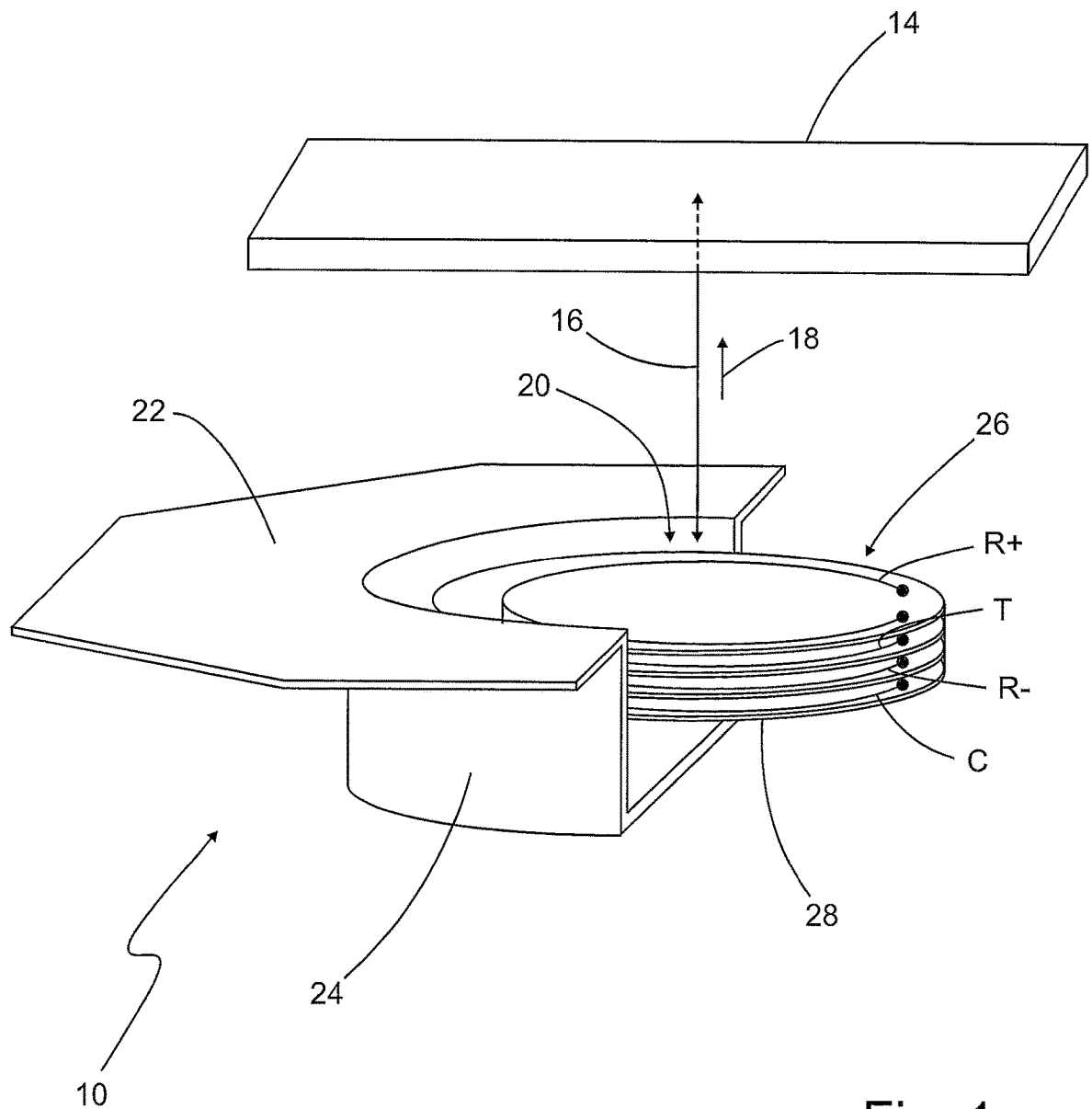
FIG. 1 shows a partially cut isometric view of a sensor element according to the invention.

FIG. 1 shows a partially cut isometric view of a sensor element 10 according to the invention. The sensor element 10 is part of an inductive proximity sensor with which the proximity of a measuring object 14 to the sensor element 10 is detected, or part of an inductive distance sensor with which the distance 16 of the measuring object 14 from the sensor element 10 is detected.

The measuring object 14 is located, in terms of the measuring direction 18, on the front face of the sensor element 10, wherein the proximity of the measuring object 14 or the distance 16 of the measuring object 14 from the sensor element 10 in relation to a sensor surface 20 is considered, which should be formed on the front face of the sensor element 10, preferably to be flush with a flange 22 of the sensor element 10.

The flange 22 is part of a shielding which further contains a shielding cup 24 that surrounds a coil arrangement 26 laterally and on the rear face of the coil arrangement 26, in relation to the measuring direction 18. The shielding containing the flange 22 and the shielding cup 24 is made from an electrically conductive material.

The shielding cup 24 is made of brass, for example, or a different material that is a good conductor of electricity. The material thickness can be in the region of 1 millimetre, for example. The material is preferably non-ferromagnetic, however can also be ferromagnetic. The shielding cup 24 shields, in particular, high-frequency signal components on the rear face of the sensor element 10. Thus, at least the higher-frequency signal components do not reach metal parts, if applicable arranged on the rear face of the sensor element 10, such as mounting parts. Furthermore, the shielding cup 24 prevents electromagnetic excitations laterally surrounding the coil arrangement 26. Thus, a flush installation of the sensor element 10 according to the invention in a surface, which can be metallically conductive, becomes possible.

Figure 1A:
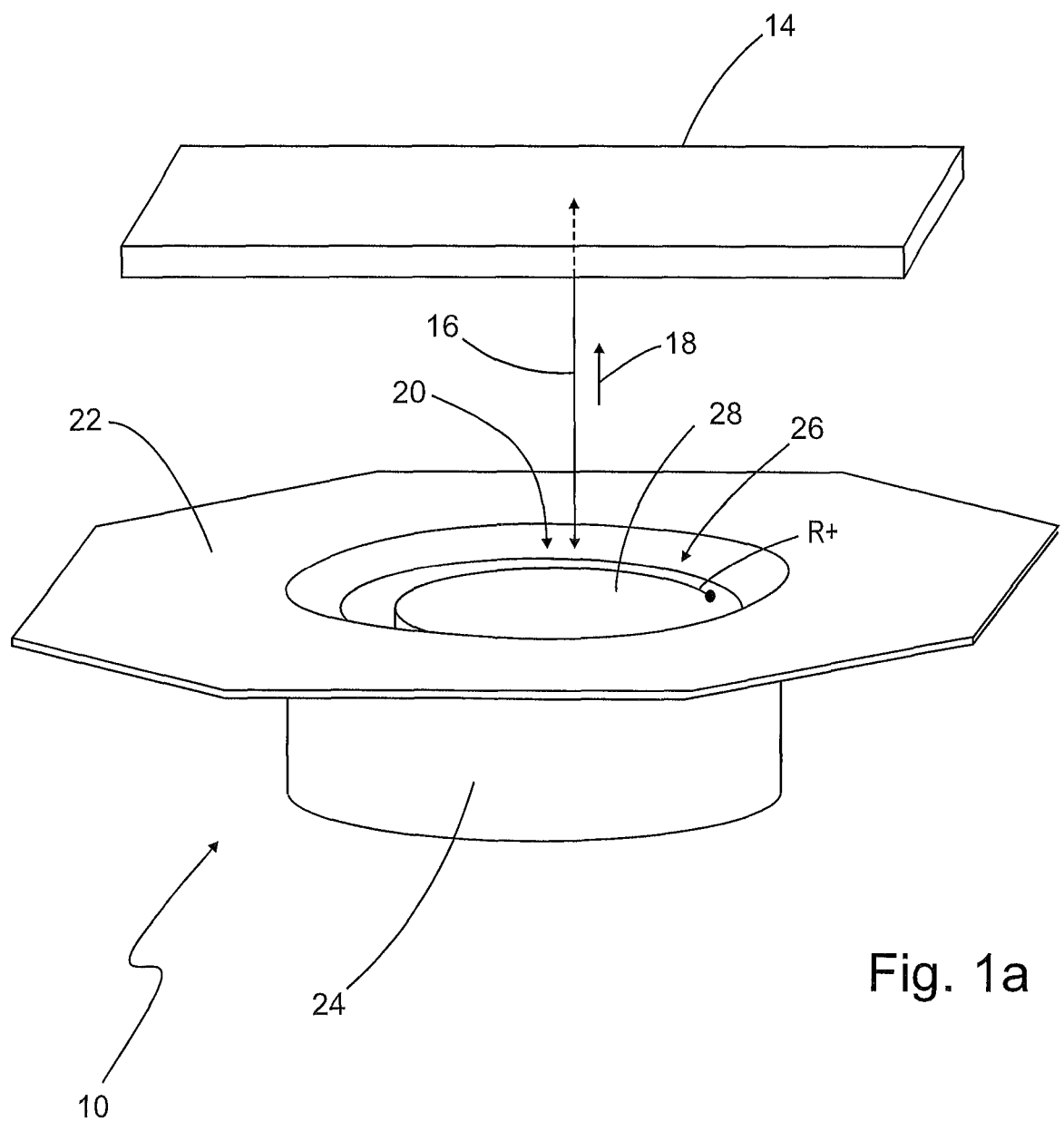
FIG. 1a shows the sensor element of FIG. 1 in which the complete enclosing of the coil arrangement by the shielding cup is shown.

The flange 22 completing the shielding, which completely encloses the coil arrangement 26 as shown in FIG. 1a, enables the formation of eddy currents. The flange 22 should extend as far as possible up to the borders of a sensor housing shown below. The flange 22 causes an electromagnetic separation of the two half spaces on the front face and on the rear face of the flange 22, in relation to the measuring object 14. The electromagnetic field of excitation coils T, C that would extend up to the rear face of the shielding cup 24, are effectively suppressed by the flange 22 because of the formation of eddy currents in the flange 22. Sensitivity of the sensor element 10 to the metallic objects that are present on the rear face of the sensor element 10 and would act as the measuring object are thus effectively suppressed.

The shielding cup 24 is preferably implemented in one piece, wherein the shielding cup 24 can be produced for example by deep-drawing of a circular metal part. The shielding cup 24 is connected to the flange 22 in an electrically conductive manner. Preferably, it is therefore provided that the shielding cup 24 and the flange 22 are also formed as one piece. The flange 22 can be implemented as a metal film, for example, which is electrically contacted by the shielding cup 24 at least on some connection points that are not shown in more detail.

In the shown exemplary embodiment, it can be assumed that the coil arrangement 26 is implemented by means of a multi-layer board 28, wherein, in the exemplary embodiment, four layers of the multi-layer board 28 can be assumed.

The multi-layer board 28 is a one-piece component. In the exemplary embodiment shown in FIG. 1, the four layers of the multi-layer board 28, are, however, shown with a distance to one another that, in practice, is treated as an optimisation parameter and is secured in a circuit-board technical manner.

On the front face of the coil arrangement 26, a first receiving coil R+ is provided, followed by the first excitation coil T, further followed by a second receiving coil R− and followed by a second excitation coil C on the rear face of the coil arrangement 26. The second excitation coil C is labelled as compensation coil C in the following. In the shown exemplary embodiment, the coils R+, T, R−, C are respectively arranged on one layer of the multi-layer board 28. An eight-layer multi-layer board 28 is provided expediently, wherein the coils R+, T, R−, C are formed to be distributed each on two adjacent layers. Purely in principle, it is also possible that two or more coils R+, T, R−, C are arranged on one single layer of the multilayer board 28.

Figure 2:
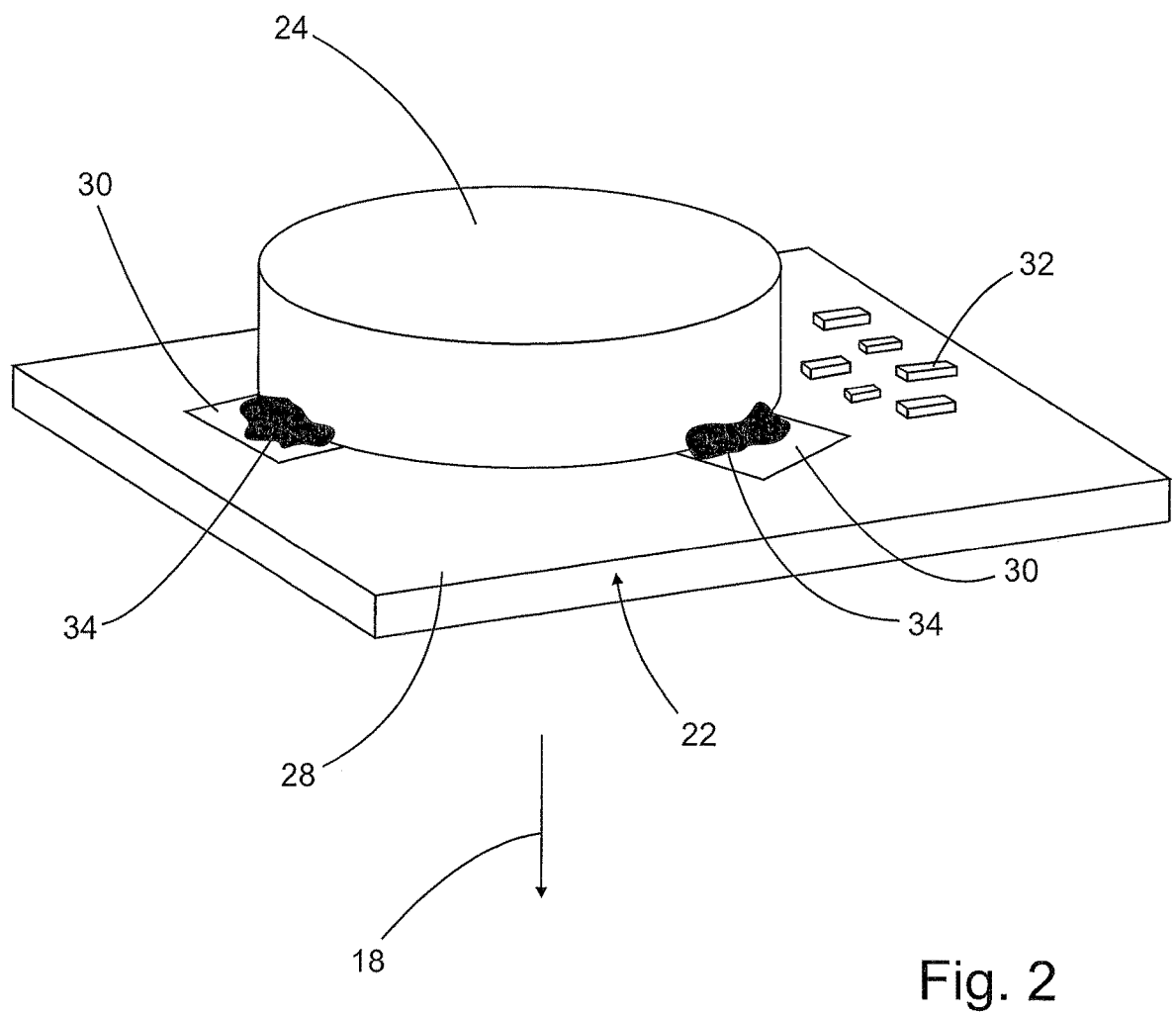
FIG. 2 shows an isometric view of the sensor element having soldering points and soldering connections according to a different embodiment.

FIG. 2 also shows an isometric back view of the sensor element 10 according to the invention. The parts that correspond to the parts shown in FIG. 1 are, in each case, provided with the same reference numeral. This agreement also applies for the following figures.

FIG. 2 shows an embodiment of the sensor element 10 according to the invention in which, on the rear face of the multi-layer board 28, soldering surfaces 30 are provided on which the shielding cup 24 is soldered by means of soldering connections 34. At the same time, the flange 22 is formed by means of the multi-layer board 28.

Additionally or alternatively, one or more cantilever extensions of the shielding cup 24 that are not shown in more detail in FIG. 2 are provided which can penetrate into corresponding recesses of the multi-layer board 28, whereby both the mechanical strength and the correct positioning of the shielding cup 24 in terms of the coil arrangement 26 can be ensured.

Figure 2A:
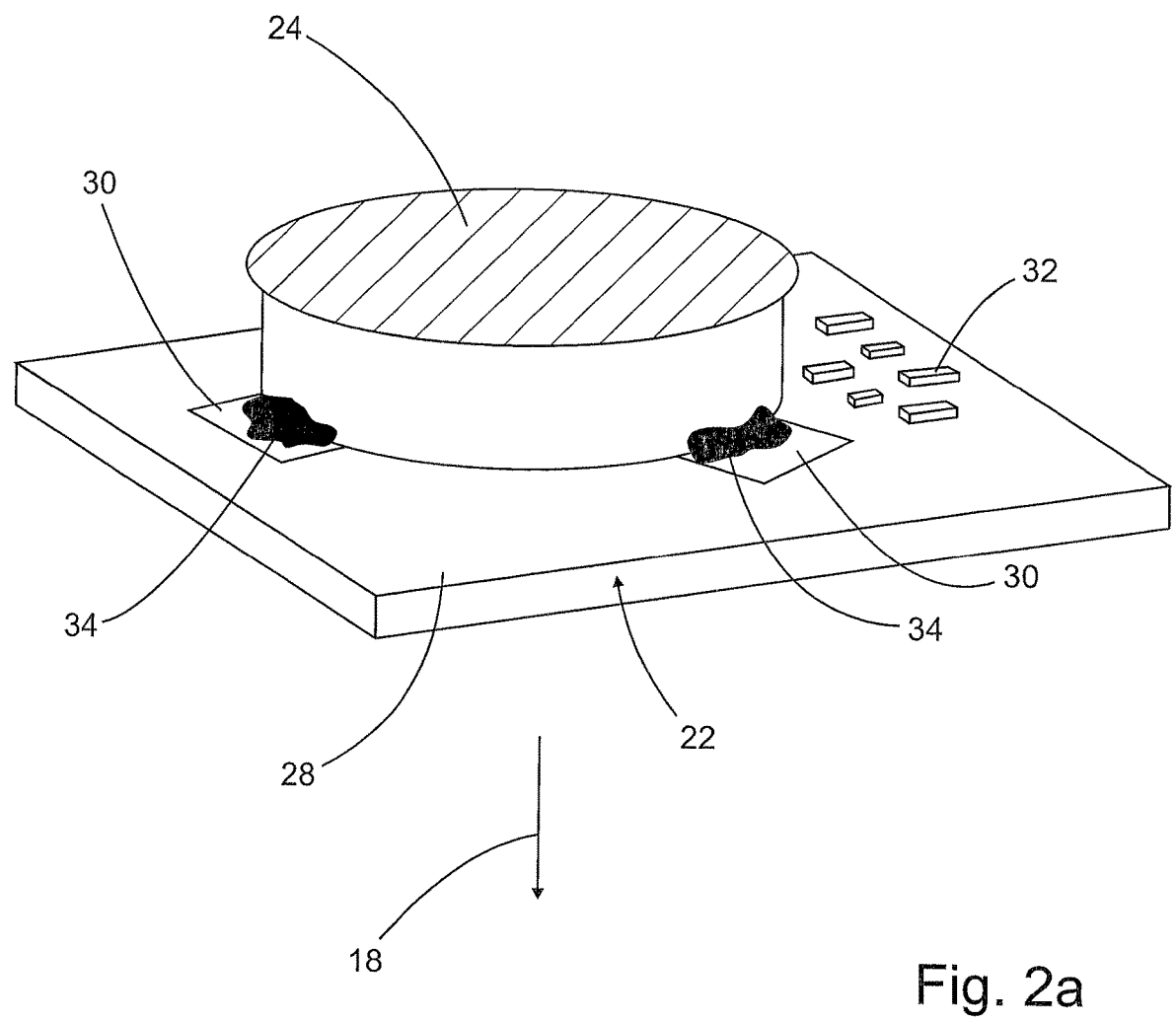
FIG. 2a shows an isometric view of an embodiment of the sensor element in which the rear part of the shielding cup is formed by a multi-layer board.

According to one embodiment, an electronic unit 32 can be provided on one or more layers, in the shown exemplary embodiment on the back-most side of the multi-layer board 28, said electronic unit 32 being electrically connected to the coils R+, T, R−, C, wherein a shortest possible cable run emerges. In the shown exemplary embodiment, however, such connections of the coils R+, T, R−, C to the electronic unit 32 are not shown. In FIG. 1, connection points of the coils R+, T, R−, C of the coil arrangement 26 that are not shown in more detail are inserted for generalization. An alternative or further cost-reduction possibility is given by the back part of the shielding cup 24 being able to be implemented as a metallic layer on at least one layer of a multi-layer board as shown in FIG. 2a.

Figure 3:
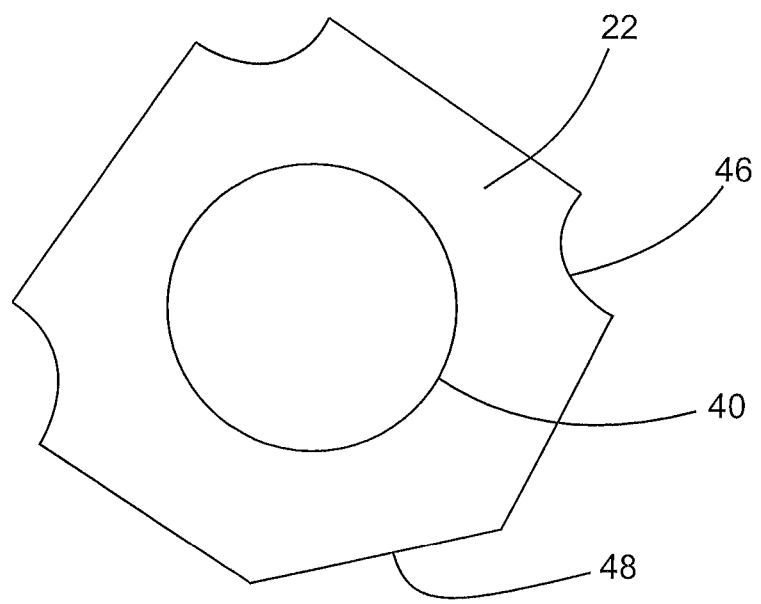
FIG. 3 shows an embodiment of a flange as part of a shielding of the sensor element.
Figure 3A:
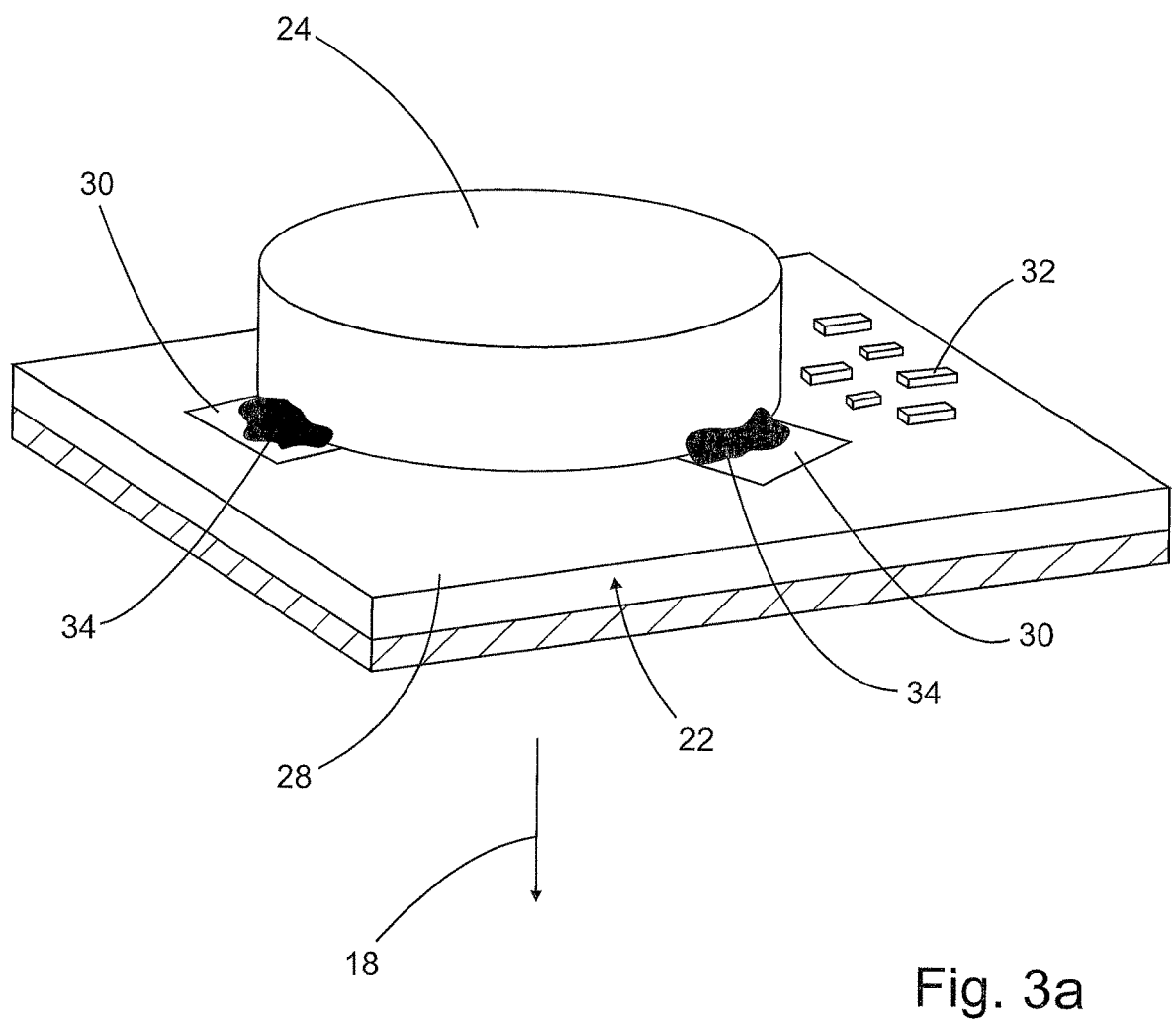
FIG. 3a shows the embodiment of FIG. 3 showing a metallic foil attached to the front side of a multi-layer board.

FIG. 3 shows an embodiment of the flange 22 in which the flange 22 is formed as a conductive metal film which is fixed on the front face of the multi-layer board 28 (see FIG. 3a) or in the inside of a front housing part, for example by adhesion. Advantageously, the whole flange 22—as shown in FIG. 2—is formed from the layers of the multi-layer board 28. Purely in principle, layers of the multi-layer board 28 can also still be in the shielding cup 24. The flange 22 has a circular opening 40 in the region of the coil arrangement 26.

In FIG. 3, an embodiment of the flange 22 is shown, on the corners of which at least one recess 46 and/or at least one cant 48 are provided. The recess 46 or the cant 48 enables a simple mounting of the sensor element 10 in a housing.

Figure 4A:
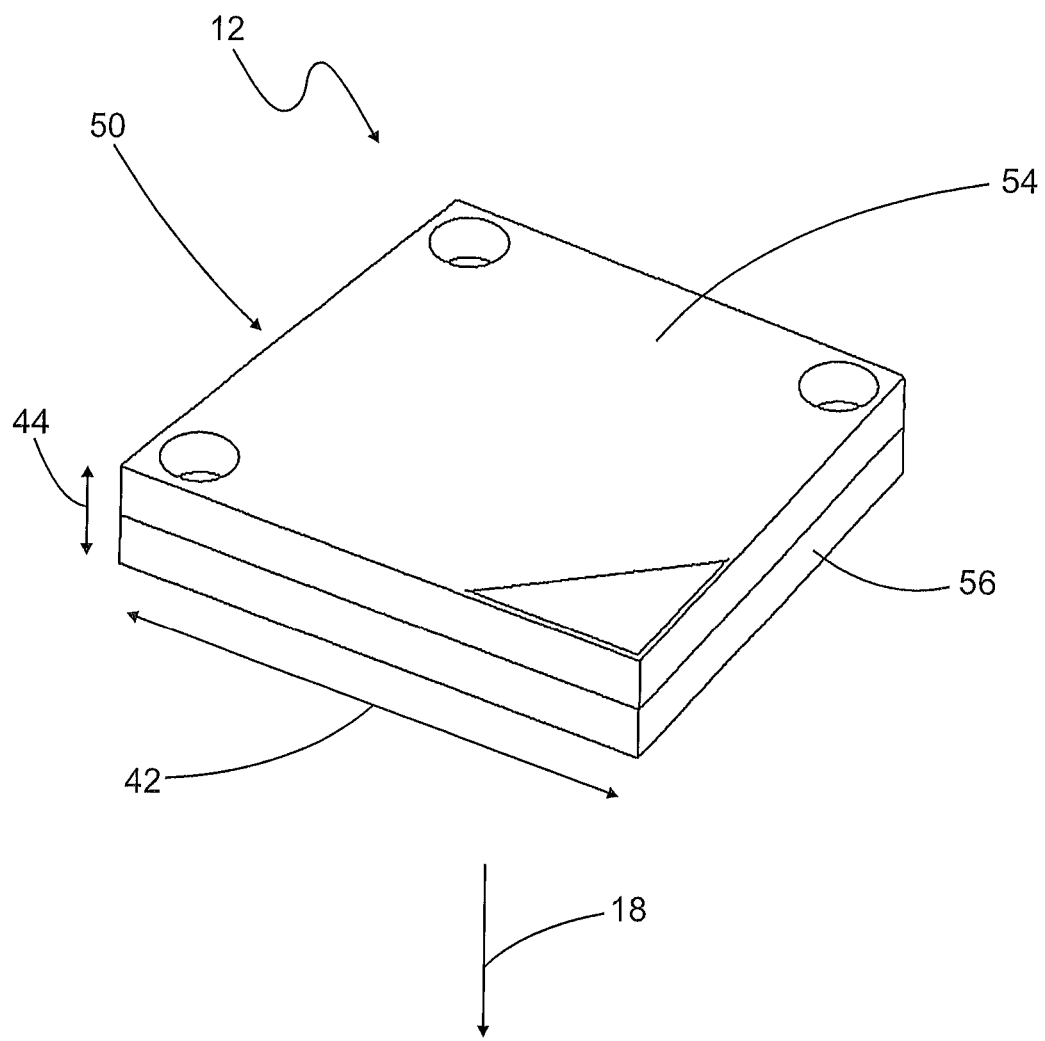
FIG. 4a shows an isometric view of the housing.

FIG. 4a shows an isometric view of the assembled housing 50. The housing 50 contains a back housing part 54 and a front housing part 56, The sensor element 10 or the housing 50 can have a comparatively large width 42 in comparison to the depth 44, because of the shielding 22, 24, wherein the depth 44 relates to the measuring direction 18. Thus, a large proximity region of the measuring object 14 on the sensor element 10 or a large distance 16 of the measuring object 10 from the sensor element 10 becomes possible, in which switching of the sensor element 10 occurs.

The housing 50 has a width 42, for example, of 40 millimetres and can be formed quadratically. In doing so, the depth 44, for example, can be 10 millimetres. With these dimensions, the proximity region of the measuring object 14 to the sensor element 10 or the distance 16 at which the sensor element 10 switches in the presence of the measuring object 14 can be in the region of a few tens of millimetres, for example 20 millimetres.

Figure 4B:
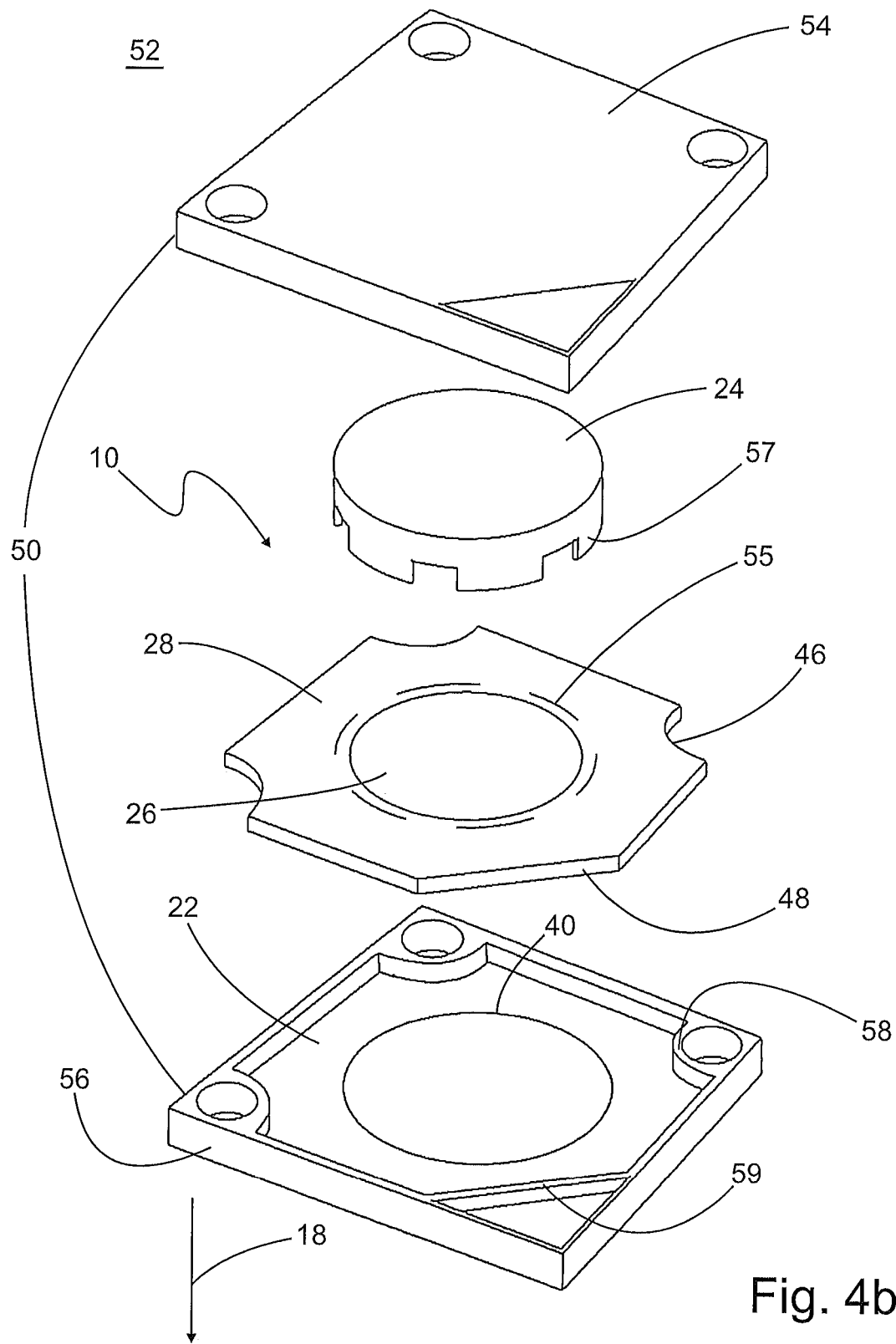
FIG. 4b shows an exploded drawing of a housing in which the sensor element is installed.

FIG. 4b shows an exploded drawing of such a housing 50 in which the sensor element 10 is installed. The housing 50 having the sensor element 10 forms an inductive proximity sensor 52 with which the proximity of the measuring object 14 to the sensor element 10 is detected, or forms an inductive distance sensor 52 with which the distance 16 of the measuring object 14 from the sensor element 10 is detected in each case.

In both housing parts 54, 56, formations 58 corresponding to the recesses 46 are provided. In particular, in the front housing part 56, a formation 59 corresponding to the cant 48 is provided.

The cant 48 prevents an incorrect positioning of the sensor element 10 in the housing 50. The cant 48 and the recesses 46 of the flange 22 enable the sensor element 10 to be reliably fixed in the housing 50.

In the exemplary embodiment shown in FIG. 4b, the multi-layer board 28 contains notches 55 in which, in the mounted state of the sensor element 10, corresponding cantilever extensions 57 of the shielding cup 24 engage.

Required connection cables and/or plug sets of the inductive proximity sensor 52 are not depicted in the figures for reasons of simplicity.

Figure 5:
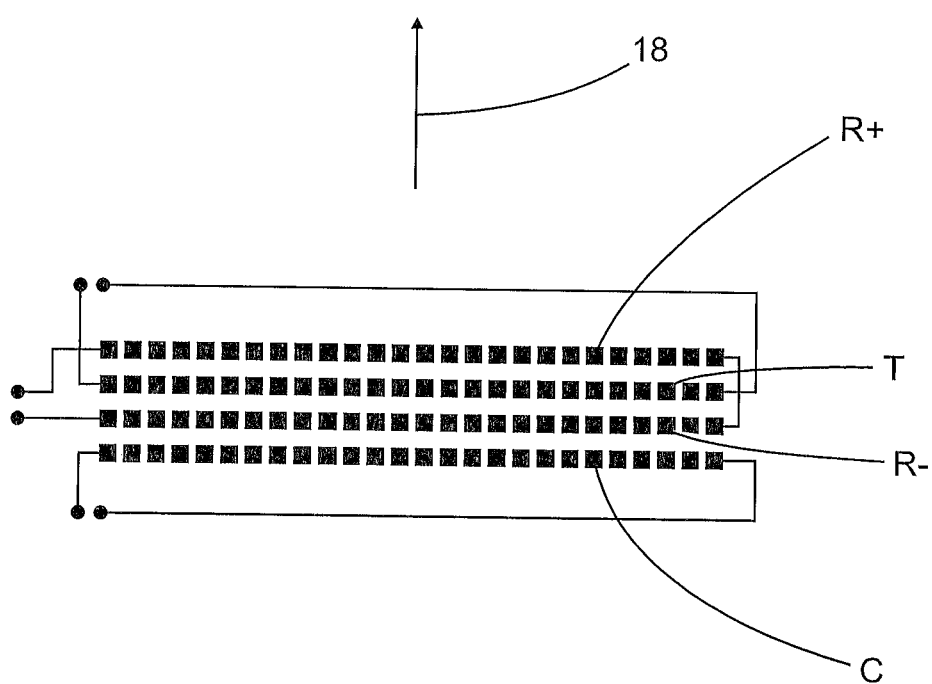
FIG. 5 shows a wiring of a coil arrangement of the sensor element according to the invention.

FIG. 5 shows a schematic sectional view through the coils R+, T, R−, C and the wiring thereof. The coils R+, T, R−, C can be arranged on different layers of the multi-layer board 28 that is not shown in more detail. It should be implied by the squares shown in the sectional view that the coils R+, T, R−, C can have a plurality of windings. It can be assumed in the shown exemplary embodiment that the two receiving coils R+, R− are inversely switched in terms of the measuring direction 18 and are switched in series. The inverse switching can also be expressed by the labelling with R+, R−. As previously mentioned, the coils R+, T, R−, C are preferably arranged to be distributed on two adjacent layers of an eight-layered multi-layer board 28.

Figure 6:
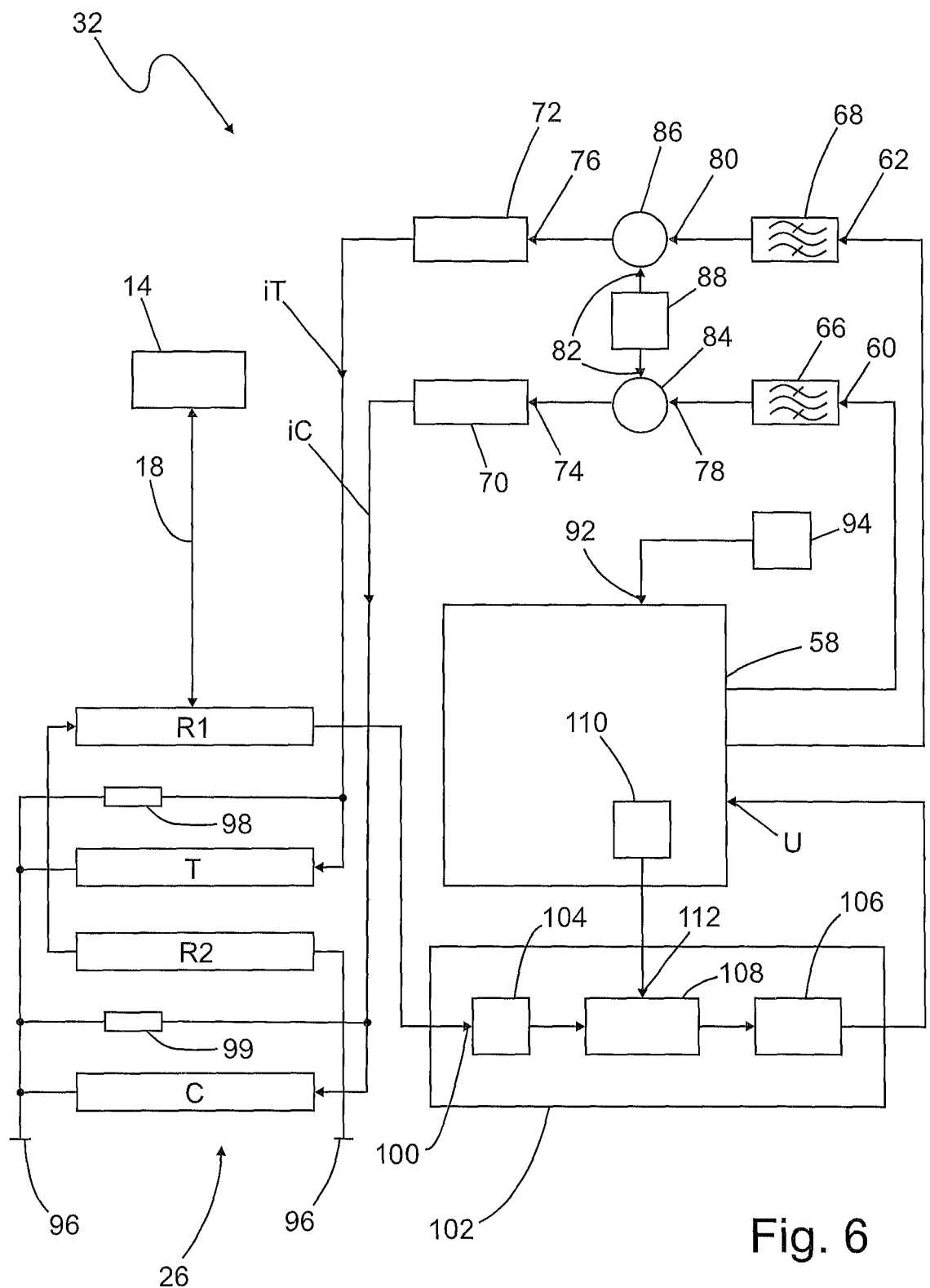
FIG. 6 shows a block wiring diagram of an electronic unit for operating the sensor element.

FIG. 6 shows a block wire diagram of the electronic unit 32 for operating the sensor element 10. A microcontroller 58 provides a first and second rectangular output signal 60, 62 from which excitation currents iT, iC of the excitation coils T, C are obtained.

The two rectangular output signals 60, 62 are allocated to a first or a second signal shaper 66, 68 which are implemented in each case as bandpass filters, for example. The signal shapers 66, 68 form continuously running excitation currents iT, iC from the rectangular outputs signals 60, 62, said excitation currents iT, iC having a predetermined temporal current course in each case. The signal shapers 66, 68 are implemented as passive bandpass filters, for example. The bandpass filters initially suppress higher-frequency signal components of the original rectangular output signals 60, 62. By doing so, a saturation of successive electronic components is prevented that could arise because of the steep-edge signals. Furthermore, the bandpass filters suppress lower-frequency signal components of the original rectangular output signals 60, 62, in particular the DC part thereof that does not generate any measuring information because of the corresponding constant current amount of the excitation currents iT, iC, but provides an undesired contribution to the energy consumption of the total system. The corner frequencies of the bandpass filters can be, for example, between ten and a few hundred kilohertz.

The excitation currents iT, iC are provided by voltage-controlled current sources 70, 72. A saturation of the voltage-controlled current sources 70, 72 can occur not only because of a too steep-edged controlling, but also because of an intermittent operation in which the excitation currents iT, iC would fall to zero. This could occur if the controlling signals 74, 76 of the voltage-controlled current sources 70, 72 either fall to zero or if the voltage-controlled current sources 70, 72 have an input-voltage offset. Therefore, a direct current voltage 82 is preferably added to the output signals 78, 80 of the signal shapers 66, 68 in each case, so that the excitation currents iT, iC cannot fall to zero at any time during the course of the excitation and data detection. In addition, adders 84, 86 are provided which add the direct current voltage 82 provided by a direct current voltage source 88 respectively to the output signals 78, 80 of the signal shapers 66, 68. The adders 84, 86 provide the control signals 74, 76 of the voltage-controlled current sources 70, 72.

According to an advantageous embodiment, it is provided that the excitation currents iT, iC can be set depending on the temperature of the coil arrangement 26. To do so, the output signal 92 of a temperature determination 94 is allocated to the microcontroller 58 which increases or decreases the maxima of the excitation currents iT, iC by changing the amplitude at least of one rectangular output signal 60 or 62, depending on the temperature of the coil arrangement 26. The temperature determination 94 of the coil arrangement 26 can take place, for example, by means of an internal resistance measurement at least of one coil R+, T, R−, C. Where necessary, a temperature sensor that is not shown in more detail can be provided.

The excitation currents iT, iC flow through the first excitation coil T or through the wide second excitation coil C that acts as a compensation coil to a switching ground 96.

According to one embodiment, parallel resistors 98, 99 are provided that are switched in parallel to the excitation coils T, C. Such a parallel resistor 98, 99 ensures a stabile functioning of the voltage-controlled current source 70, 72 because of the present ohmic components in the load circuit, in addition to the inductance of the excitation coils T, C. The excitation currents iT, iC are provided, for example, by a field-effect transistor or bipolar transistor contained in each case in the voltage-controlled current sources 70, 72, said transistors being controlled by an operation amplifier. The inductances of the excitation coils T, C lie, for example, in the region of 12 microhenry and, at room temperature, have an ohmic resistance of 18 Ohm, for example. The parallel resistors 98, 99 are set to a value between 100-470 Ohm, for example.

It is assumed in the shown exemplary embodiment that the receiving coils R+, R− are switched in series inversely to each other. The measuring voltage 100 induced in the receiving coils R+, R− is allocated to an amplifier 102 that is preferably implemented on two levels. The first amplifier level 104 of the amplifier 102 is preferably implemented as a condenser-coupled transimpedance amplifier. A digitally switchable signal attenuator 108 is preferably provided between the first amplifier level 104 and the second amplifier level 106, said signal attenuator 108 enabling a signal adjustment to the second amplifier level 106.

The microcontroller 58 contains a function block 110 which provides a digital control signal 112 for the signal attenuator 108. The digital control signal 112 is set by the function block 110 depending on the output signal U of the amplifier 102, and indeed in such a way that overcontrolling the second amplifier level 106 of the amplifier 102 is avoided. Setting the digital control signal 112 expediently takes place adaptively. The digital control signal 112 preferably does not attenuate the whole signal equally. Advantageously, a time delay in terms of the start of an excitation current pulse iT, iC is provided, which ensures that the attenuation is only effective in the region of the signal maximum of the signal occurring between the two amplifier levels 104, 106 of the amplifier 102. Thus, on the one hand, a high total amplification of the measuring voltage 100 is ensured, however overcontrolling the second amplifier level 106 is avoided.

Figure 7:
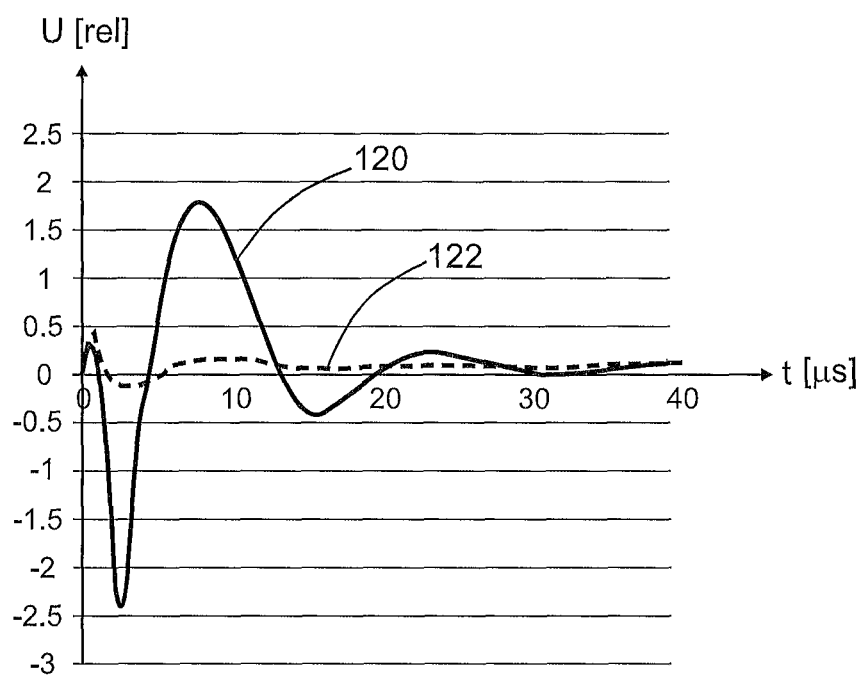
FIG. 7 shows two signal courses of an output signal.

FIG. 7 shows a possible output signal U of the amplifier 102 depending on the time t. The first temporal signal course 120 that is depicted by the solid line, corresponds to a temporal signal course that would occur without the second excitation coil C that acts as a compensation coil. The second temporal signal course 122, which is depicted by the interrupted line, is obtained by the second excitation coil C that acts as a compensator coil, said excitation coil C being operated by an excitation current iC, the temporal course of which and the amplitude of which are able to deviate from the temporal course or the maximum of the excitation current iT of the first excitation coil T. The second temporal signal course 122 corresponds to the minimally obtainable background signal without a measuring object 14, for example. The output signal U is depicted with relative units, wherein the numerical data, however, can correspond to volt data.

For further compensation, the second temporal signal course 122 that is shown in FIG. 7 and corresponds to the background signal can be subtracted from the output signal U. Furthermore, a temperature-dependent background signal can be subtracted from the output signal U for the temperature compensation. The temperature-dependent background signal can be determined experimentally or be calculated by the microcontroller 58 from stored temperature coefficients depending on the temperature.

Figure 8:
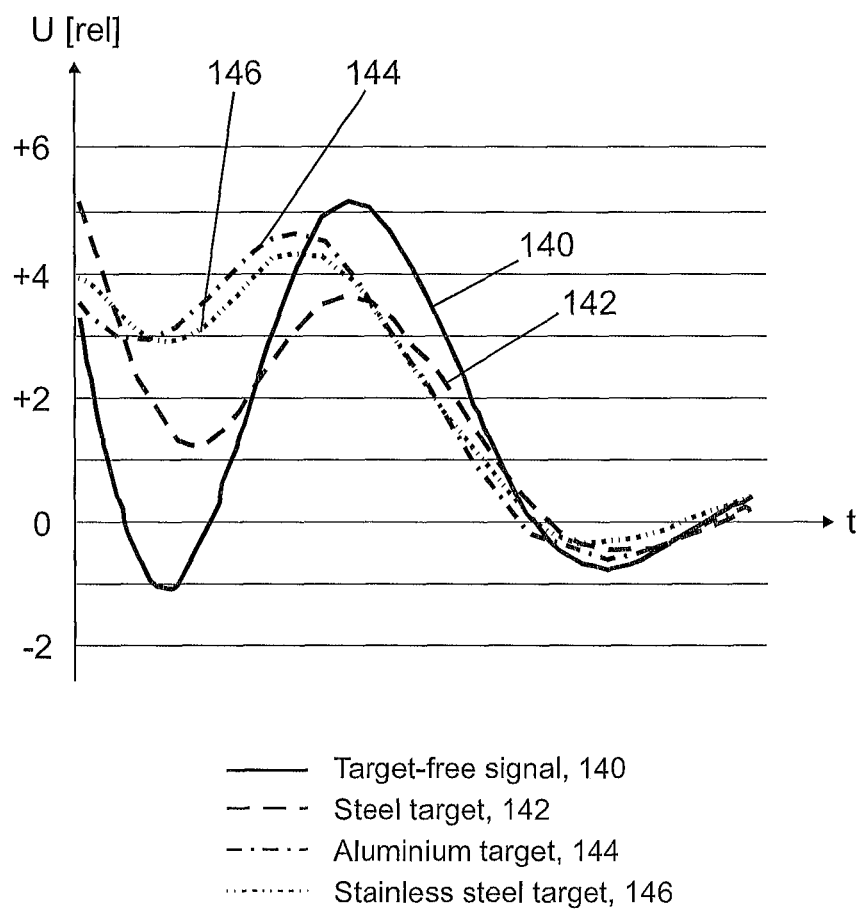
FIG. 8 shows four signal courses of an output signal depending on a measuring object, the proximity of which to the sensor element or the distance of which from the sensor element is to be detected

FIG. 8 shows four temporal signal courses 140-146 depending on the time t that occur with different measuring objects 14 at the same distance 16. The solid line corresponds to a first temporal signal course 140 that occurs with a measuring object 14 that is not present. The first signal course 140 thus corresponds to the background signal that is preferably subtracted from the output signal U in the microcontroller 58. The second temporal signal course 142 corresponds, for example, to a measuring object 14 made of steel, the third temporal signal course 144 corresponds, for example, to a measuring object 14, made of aluminium and the fourth temporal signal course 146 corresponds, for example, to a high-grade steel measuring object 14. The output signal U obtained from the measuring voltage 100 is depicted in relative units, wherein the numerical data, however, can be volt data, for example.

Figure 9:
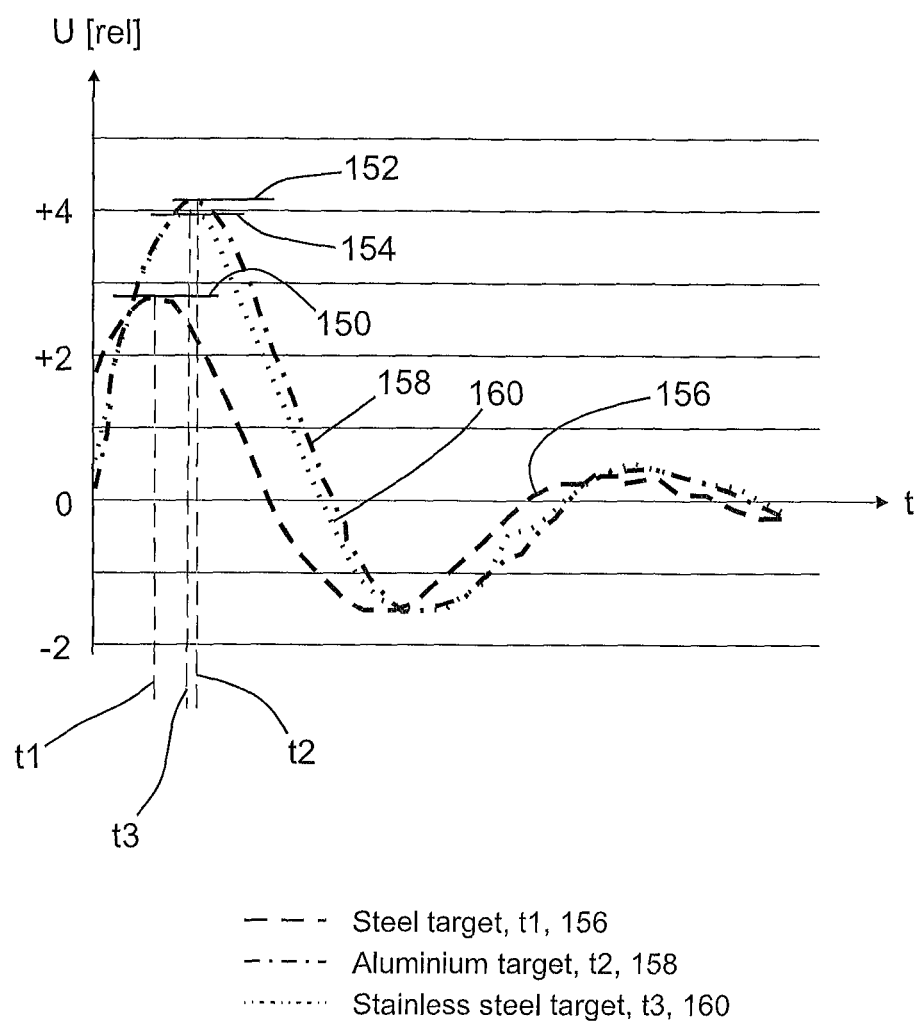
FIG. 9 shows three such signal courses of an output signal depending on the measuring object.

In FIG. 9, courses 156, 158, 160 corresponding to the second, third and fourth signal course 142-146 are depicted, wherein the courses 156, 158, 160 are calculated in each case by subtracting the background signal 140 from the signal courses 142, 144, 146, and wherein the first signal maxima 150, 152, 154 of the signal courses 156, 158, 160 and the points in time t1, t2, t3 are recorded, when the first signal maxima 150, 152, 154 occur. Furthermore, signal minima of the signal courses 156, 158, 160 occur at times that are determined, but not recorded in more detail.

According to an advantageous embodiment it is provided that measuring objects 14 made of different material are measured at a predetermined distance 16 and the emerging temporal signal courses 142, 144, 146 or 156, 158, 160 are recorded in a storage of the microcontroller 58 that is not shown in more detail for later comparison to the output signal U of the amplifier 102.

From FIGS. 8 and 9 it is immediately obvious that the sensor element 10 can be operated by recorded reference signal courses in such a way that identifying the material of the measuring object 14 is possible. Thus, different measuring objects 14 can be distinguished from one another. Identifying the material of the measuring object 14 is possibly, simply by means of determining the different points in time t1, t2, t3 at which the first signal maxima 150, 152, 154 of the temporal signal courses 156, 158, 160 occur. Alternatively or additionally, detecting and comparing the signal maxima 150, 152, 154 can take place. Further alternatively or additionally, the signal minima not recorded in more detail in FIG. 9 that also occur at times to be determined, can also be detected and used for the comparison.

In particular, the sensor element 10 according to the invention can also be operated independently of the material of the measuring object 14, whereby a so-called factor-1 operation of the inductive distance sensor or inductive proximity sensor is possible. In this case, a comparison of the temporal signal courses 142, 144, 146 or 156, 158, 160 to the reference signal courses recorded in a storage is made, wherein, however, in this case, distinctions are not made according to the material of the measuring object 14, but the proximity of the measuring object 14 to the sensor element 10 is detected or a certain distance 16 of the measuring object 14 from the sensor element 10 is recognised independent of the material of the measuring object 14, with which the sensor element 10 switches.

The invention claimed is:

1. A sensor element of an inductive proximity sensor or distance sensor, the sensor element comprising:
   a shielding comprising a flange and a shielding cup, the shielding being electrically-conductive, the flange being connected to the shielding cup in an electrically conductive manner, the shielding cup having a first longitudinal end and a second longitudinal end disposed opposite from the first longitudinal end; and
   a coil arrangement comprising at least one excitation coil and at least one receiving coil;
   wherein the shielding cup surrounds the coil arrangement laterally and with the second longitudinal end;
   wherein the flange is connected to the first longitudinal end of the shielding cup;

wherein the flange completely encloses the coil arrangement;

wherein the excitation coil is connected to a voltage-controlled current source, which provides the excitation current of the excitation coil;

wherein, for controlling the voltage-controlled current source, a signal shaper is provided for shaping a temporal current course of the excitation current;

wherein the signal shaper contains a bandpass filter which suppresses lower-frequency and higher-frequency signal components; and wherein an addition of a direct current voltage on the output signal of the signal shaper is provided.

2. The sensor element according to claim 1, wherein the shielding cup is made from one piece.

3. The sensor element according to claim 1, wherein the shielding cup and the flange are made from one piece.

4. The sensor element according to claim 1, wherein the flange is implemented as a metal film.

5. The sensor element according to claim 1, wherein the at least one excitation coil is disposed behind the at least one receiving coil in a direction away from the flange.

6. The sensor element according to claim 1, wherein the coil arrangement is arranged on a multi-layer board.

7. The sensor element according to claim 6, wherein the shielding cup has at least one cantilever extension for fixing the shielding cup on the multi-layer board.

8. The sensor element according to claim 1, wherein an ohmic resistor is connected in parallel to the excitation coil.

9. The sensor element according to claim 1, wherein a microcontroller for providing a digital output signal for controlling the signal shaper is provided.

10. The sensor element according to claim 9, wherein a two-stage amplifier is provided for amplifying a measuring voltage provided by the at least one receiving coil.

11. The sensor element according to claim 10, wherein at least a first amplifier stage of the two-stage amplifier is a capacitor-coupled transimpedance amplifier.

12. The sensor element according to claim 1, further comprising a sensor housing having a depth and a width, the width being greater than the depth, the depth being related to a measuring direction;

wherein the coil arrangement and the shielding are arranged in the sensor housing.

13. A method for operating the sensor element of claim 1, wherein a distance of a measuring object from the sensor element is determined;

wherein a temporal course of an excitation current flowing in the at least one excitation coil is set in such a way that a background signal contained in a measuring voltage or in an output signal of an amplifier, said background signal being present without the measuring object, is minimized; and wherein the excitation current is set depending on the temperature of the at least one excitation coil.

14. The method according to claim 13, wherein a current maximum of the excitation current flowing in the at least one excitation coil is set in such a way that the background signal is minimized.

15. The method according to claim 13, wherein the background signal is subtracted from the output signal of the amplifier.

16. The method according to claim 13, wherein the measuring object is made from a selected material and the temporal current course the excitation current and/or a current maximum are set to maximize sensitivity of the sensor element to the measuring object made from the selected material.

17. The method according to claim 13, wherein the at least one excitation coil comprises a first excitation coil and a second excitation coil; and wherein the first and the second excitation coils are supplied with the excitation current at the same time.

18. The method according to claim 13, wherein magnetic and/or electrical properties of the measuring object are determined by evaluating an output signal of the amplifier in terms of a signal maximum and/or a temporal signal course.

19. A method for operating the sensor element of claim 1, wherein a distance of a measuring object from the sensor element is determined; and wherein a temporal course of an excitation current flowing in the at least one excitation coil is set in such a way that a background signal contained in a measuring voltage or in an output signal of an amplifier, said background signal being present without the measuring object, is minimized.

20. A method for operating the sensor element of claim 1, wherein a distance of a measuring object from the sensor element is determined; and wherein a temporal course of an excitation current flowing in the at least one excitation coil is set depending on a temperature of the at least one excitation coil.

21. A sensor element of an inductive proximity sensor or distance sensor, the sensor element comprising:

a shielding comprising a flange and a shielding cup, the shielding being electrically-conductive, the flange being connected to the shielding cup in an electrically conductive manner, the shielding cup having a first longitudinal end and a second longitudinal end disposed opposite from the first longitudinal end; and a coil arrangement comprising at least one excitation coil and at least one receiving coil;

wherein the shielding cup surrounds the coil arrangement laterally and with the second longitudinal end;

wherein the flange is connected to the first longitudinal end of the shielding cup;

wherein the flange completely encloses the coil arrangement;

wherein the excitation coil is connected to a voltage-controlled current source, the voltage-controlled current source providing an excitation current of the excitation coil;

wherein a microcontroller for providing a digital output signal for controlling a signal shaper for shaping a temporal current course of the excitation current is provided;

wherein a two-stage amplifier is provided for amplifying a measuring voltage provided by the at least one receiving coil; and wherein at least a first amplifier stage of the two-stage amplifier is a capacitor-coupled transimpedance amplifier.

22. The sensor element according to claim 21, wherein a signal attenuator is provided between the first amplifier stage and a second amplifier stage.

23. The sensor element according to claim 22, wherein the microcontroller contains a function block which provides a digital control signal for the signal attenuator, which furthermore contains a time delay, the delayed time of which depends on a temporal signal course of the output signal of the amplifier; and wherein the delayed time is set in such a way that an attenuation of the signal occurring between the first and second amplifying stages occurs in a region of a signal maximum such that overcontrolling the first and second amplifier stages is avoided.

* * * * *